US006867591B2

(12) United States Patent
Nelson

(10) Patent No.: US 6,867,591 B2
(45) Date of Patent: Mar. 15, 2005

(54) NMR TRANSFER STANDARD

(75) Inventor: Ian Nelson, Chapel Hill, NC (US)

(73) Assignee: Medi-Physics, Inc., Princeton, NJ (US)

( * ) Notice: Subject to any disclaimer, the term of this patent is extended or adjusted under 35 U.S.C. 154(b) by 114 days.

(21) Appl. No.: 10/741,610

(22) Filed: Dec. 19, 2003

(65) Prior Publication Data

US 2004/0145368 A1 Jul. 29, 2004

Related U.S. Application Data

(60) Provisional application No. 60/435,101, filed on Dec. 20, 2002.

(51) Int. Cl.[7] .............................................. G01V 3/00
(52) U.S. Cl. ..................................... 324/317; 324/308
(58) Field of Search ................................ 324/317, 318, 324/322, 307, 308, 309, 312, 300

(56) References Cited

U.S. PATENT DOCUMENTS

| 4,452,250 | A | | 6/1984 | Chance et al. |
| 5,545,396 | A | | 8/1996 | Albert et al. |
| 5,642,625 | A | | 7/1997 | Cates, Jr. et al. |
| 5,809,801 | A | | 9/1998 | Cates, Jr. et al. |
| 6,079,213 | A | | 6/2000 | Driehuys et al. |
| 6,295,834 | B1 | | 10/2001 | Driehuys |
| 6,356,080 | B1 | * | 3/2002 | Daniels ....................... 324/313 |
| 6,486,666 | B1 | * | 11/2002 | Grossmann et al. ........ 324/300 |
| 6,566,875 | B1 | * | 5/2003 | Hasson et al. .............. 324/309 |
| 2001/0029739 | A1 | | 10/2001 | Driebuys et al. |

FOREIGN PATENT DOCUMENTS

JP          60050441          3/1985

OTHER PUBLICATIONS

Mugler, J.P. et al., "MR Imaging and Spectroscopy Using Hyperpolarized 129Xe Gas: Preliminary Human Results" Magnetic Resonance in Medicine, Academic Press, Deuluth, MN, US vol. 37, No. 6, Jun. 1, 1997 pp. 809–815.
International Search Report for corresponding PCT application PCT/US03/40715 mailed May 12, 2004.

* cited by examiner

Primary Examiner—Louis Arana
(74) Attorney, Agent, or Firm—Robert F. Chisholm

(57) ABSTRACT

A device for simulating a sample of gas having a specific level of polarization when measured by a NMR pickup coil includes an active circuit loosely coupled to the NMR pickup coil. The active circuit responds as a hyperpolarized gas having the specific level of polarization when measured by the NMR pickup coil.

17 Claims, 9 Drawing Sheets

NMR TRANSFER STANDARD

This application claims priority to U.S. Provisional Application No. 60/435,101 filed Dec. 20, 2002, the entire disclosure of which is hereby incorporated by reference herein.

FIELD OF THE INVENTION

The present invention relates to the fields of Magnetic Resonance Imaging (MRI) and NMR spectroscopy. More specifically, the present invention is directed to equipment and methods for calibrating equipment used to measure the polarization of a substance.

BACKGROUND OF THE INVENTION

It has been discovered that polarized inert noble gases can produce improved MRI images of certain areas and regions of the body that have heretofore produced less than satisfactory images in this modality. Polarized helium-3 ("$^3$He") and xenon-129 ("$^{129}$Xe") have been found to be particularly suited for this purpose. Unfortunately, as will be discussed further below, the polarized state of the gases is sensitive to handling and environmental conditions and can, undesirably, decay from the polarized state relatively quickly.

Polarizers are used to produce and accumulate hyperpolarized noble gases. Polarizers artificially enhance the polarization of certain noble gas nuclei (such as $^{129}$Xe or $^3$He) over the natural or equilibrium levels, i.e., the Boltzmann polarization. Such an increase is desirable because it enhances and increases the MRI signal intensity, thereby providing better images or signals of the substance in the body. See U.S. Pat. Nos. 5,545,396; 5,642,625; 5,809,801; 6,079,213, and 6,295,834; the disclosures of these patents are hereby incorporated by reference herein as if recited in full herein.

In order to produce the hyperpolarized gas, the noble gas can be blended with optically pumped alkali metal vapors such as rubidium ("Rb"). These optically pumped metal atoms collide with the noble gas atoms and hyperpolarize the noble gas nuclei through a phenomenon known as "spin-exchange." The "optical pumping" of the alkali metal vapor is produced by irradiating the alkali-metal vapor with circularly polarized light at the wavelength of the first principal resonance for the alkali metal (e.g., 795 nm for Rb). Generally stated, the ground state atoms become excited, then subsequently decay back to the ground state. Under a modest magnetic field (about 10 Gauss), the cycling of atoms between the ground and excited states can yield nearly 100% polarization of the atoms in a few microseconds. This polarization is generally carried by the lone valence electron characteristics of the alkali metal. In the presence of non-zero nuclear spin noble gases, the alkali-metal vapor atoms can collide with the noble gas atoms in a manner in which the polarization of the valence electrons is transferred to the noble-gas nuclei through a mutual spin flip "spin-exchange."

The alkali metal is removed from the hyperpolarized gas prior to introduction into a patient to form a non-toxic and/or sterile composition. Other polarization techniques not employing alkali metal spin exchange can also be employed as is known to those of skill in the art.

Unfortunately, the hyperpolarized state of the gas can deteriorate or decay relatively quickly and therefore must be handled, collected, transported, and stored carefully. The "$T_1$" decay constant associated with the hyperpolarized gas' longitudinal relaxation time is often used to describe the length of time it takes a gas sample to depolarize in a given situation, generally by about 36.7%. The handling of the hyperpolarized gas is critical because of the sensitivity of the hyperpolarized state to environmental and handling factors and the potential for undesirable decay of the gas from its hyperpolarized state prior to the planned end use, i.e., delivery to a patient for imaging. Processing, transporting, and storing the hyperpolarized gases—as well as delivery of the gas to the patient or end user—can expose the hyperpolarized gases to various relaxation mechanisms such as magnetic gradients, contact-induced relaxation, paramagnetic impurities, and the like.

The actual polarization level of the gas can be measured using a polarization measurement station 12 as depicted in FIGS. 1 and 2. Polarization measurement station 12 includes an NMR pickup coil 14 held by a planar substrate 16 horizontally spanning the axis of a first and second annular coil form 18 and 20. Pickup coil 14 is connected to an NMR pickup circuit 15. Coil forms 18 and 20 are about 30 inches in diameter while pickup coil 14 measures about one inch in diameter. When measuring the polarization of a gas sample, the polarized gas sample 11 is positioned upon substrate 16 over pickup coil 14. Polarization measurement station 12 may be calibrated before leaving its manufacture facility through comparison with thermally polarized $H_2O$ in a high field NMR magnet.

However, there is no method for checking that calibration while the polarization measurement station 12 is in the field. The high field NMR magnet and spectrometer used in the factory is not readily portable, and there is no calibrated method of measuring $^3$He polarization in the field other than with the polarimetry station itself. There is therefore a need for a transfer standard, analagous to a set of weights for a scale, to check the calibration of devices designed to measure the polarization of a hyperpolarized gas. An ideal transfer standard, for example, would be a sample of a hyperpolarized gas having a fixed level of polarization which does not decay with time so as to appear to polarization measurement station 12 like a perpetually hyperpolarized bag of $^3$He.

SUMMARY OF THE INVENTION

In view of the needs of the art, the present invention provides equipment and methods for calibrating a polarization measurement station.

The present invention provides a transfer standard device having an active electronic circuit which simulates a sample of gas polarized to a specific level. The circuit may include a coil. When placed in a polarization measurement station, the present invention will always read that specific level of polarization. For example, a transfer standard prototype having a circuit that always responds as a sample of $^3$He polarized to 23.8% has been constructed.

The present invention further provides a method for testing the calibration of an instrument for measuring the polarization of a sample, wherein the instrument includes an NMR pickup coil connected to NMR pickup circuitry. The method includes the step of placing an active circuit adjacent to the NMR pickup coil, wherein the active circuit is loosely coupled to the NMR pickup coil and responds as a hyperpolarized gas having a specific level of polarization when measured by the NMR pickup coil.

The present invention still further provides a method for calibrating a polarization measurement station having an NMR pickup coil connected to NMR pickup circuitry. The method includes the step of placing an active circuit adjacent to the NMR pickup coil, wherein the active circuit responds as a hyperpolarized gas having a specific level of polarization when measured by the NMR pickup coil. Then the instrument for measuring the polarization of a sample is adjusted so as to be calibrated to read the specific level of polarization of the active circuit.

The transfer standard's apparent "polarization" is first measured on a calibrated polarization measuring device. This is done by placing the transfer standard on the device in place of polarized gas and taking a measurement with the device just as though a polarized gas sample were present. The transfer standard is then assigned the apparent polarization measured by the device. The transfer standard can then be removed to the location of another such device and measured in the same way. The calibration of the second device can then be adjusted to match the first.

DETAILED DESCRIPTION OF THE PREFERRED EMBODIMENT

Figure 1:
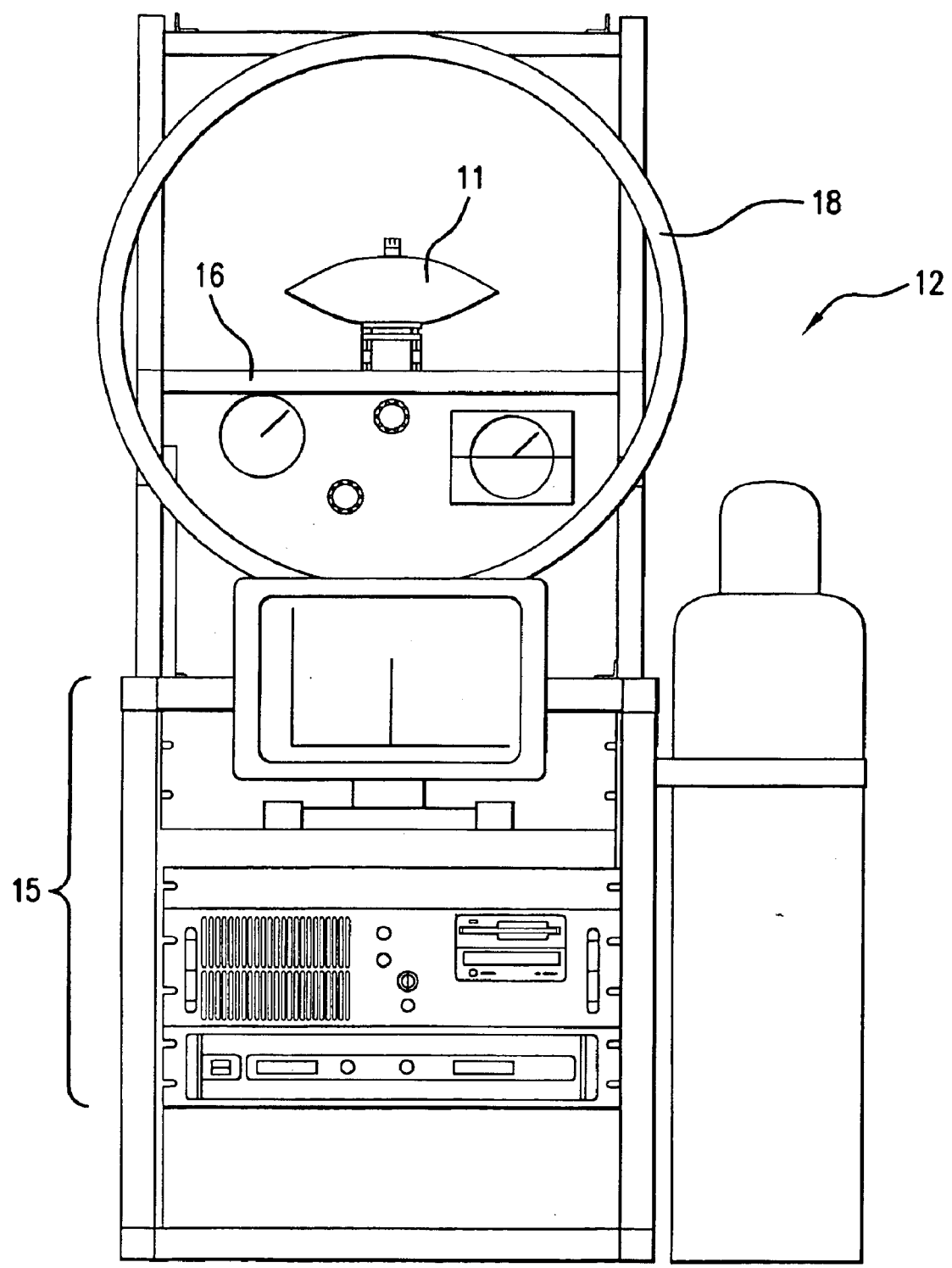
FIG. 1 depicts a polarization measurement station incorporating an NMR pickup coil.
Figure 2:
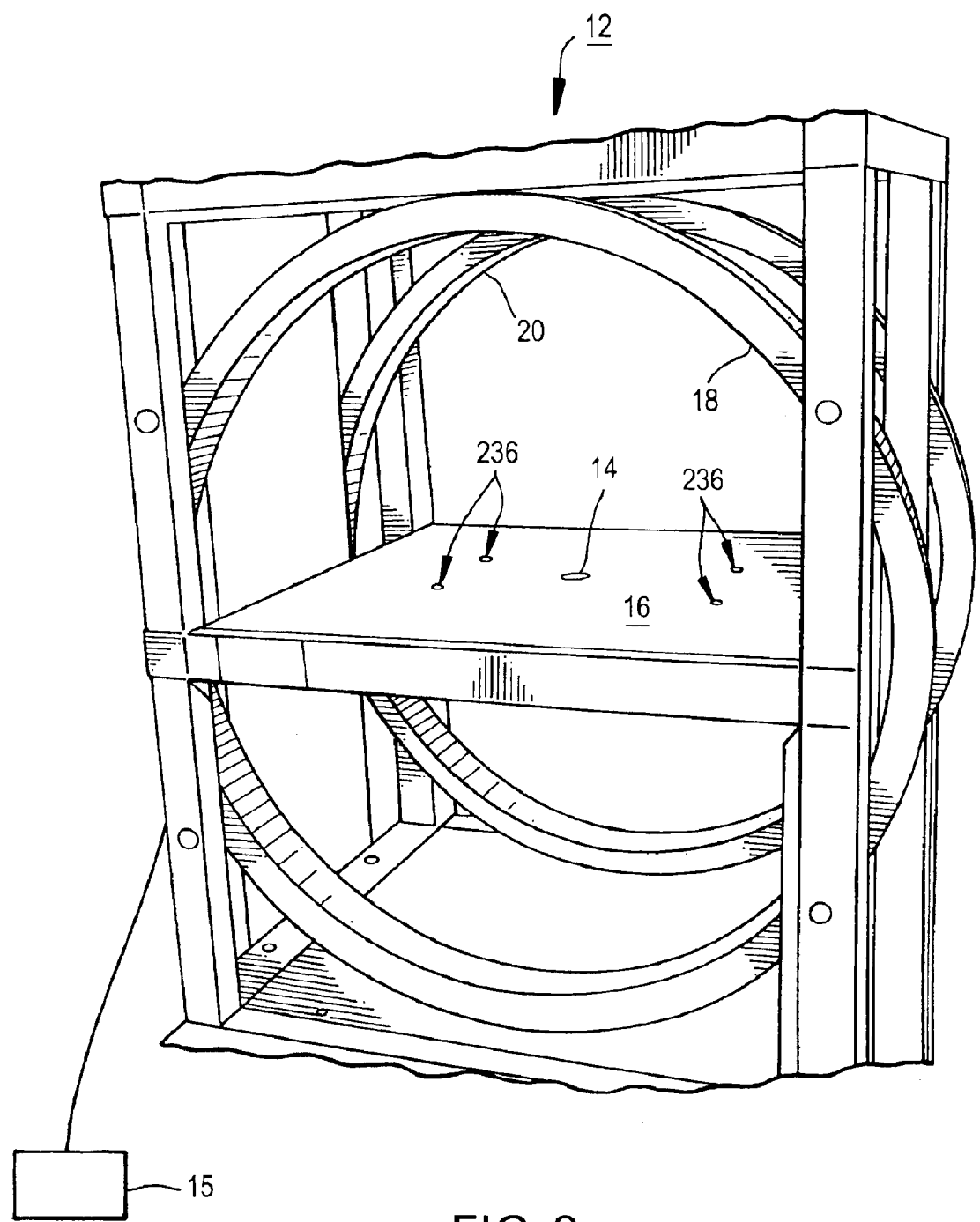
FIG. 2 is an alternate depiction of a polarization measurement station incorporating an NMR pickup coil.
Figure 3:
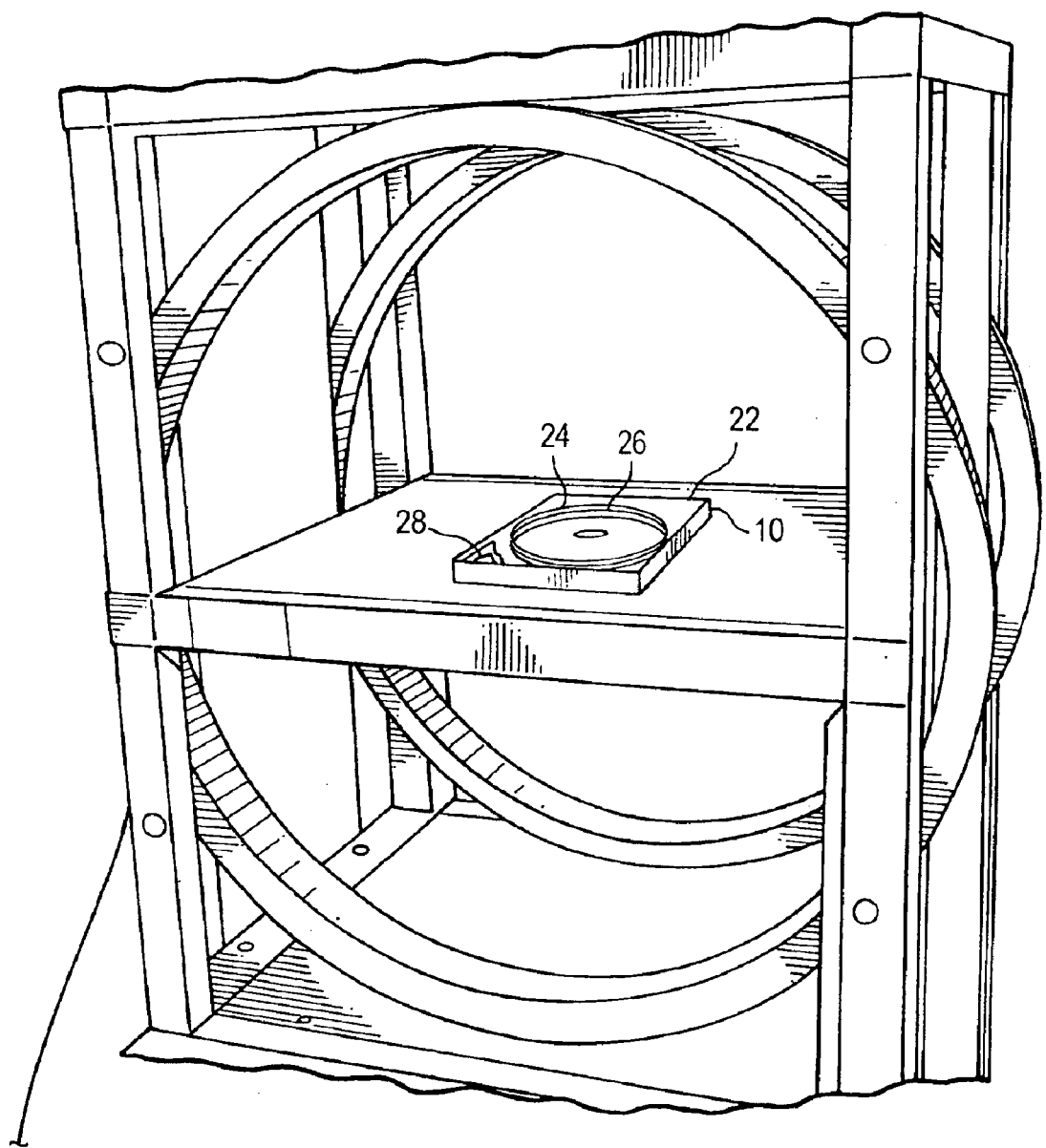
FIG. 3 depicts a transfer standard of the present invention positioned in the polarization measurement station of FIG. 2.

With reference to FIG. 3, the present invention provides a transfer standard 10 for use in a polarization measurement station 12. Transfer standard 10 includes a 9-inch by 9-inch by 1-inch container 22. Transfer standard 10 is shown in a partial cut-away view in FIG. 3 to include an 8 inch transfer standard coil 24 having a 5-turn loop 26 connected to an active, e.g. battery powered, circuit 28 powered by a 9 volt battery power source. Container 22 desirably includes indicia for positioning transfer standard 10 on substrate 16 so that coil 24 is in axial-alignment with pickup coil 14.

To use a transfer standard 10 of the present invention, the apparent "polarization" must first be measured on a calibrated polarization measuring device. This is done simply by placing the transfer standard on the calibrated polarization measuring device in place of polarized gas and taking a measurement with the device just as though a polarized gas sample were present. The transfer standard is then assigned the apparent polarization measured by the device. The transfer standard can then be removed to the location of another such device and measured in the same way; the calibration of the second device can then be adjusted to match the first.

Figure 4:
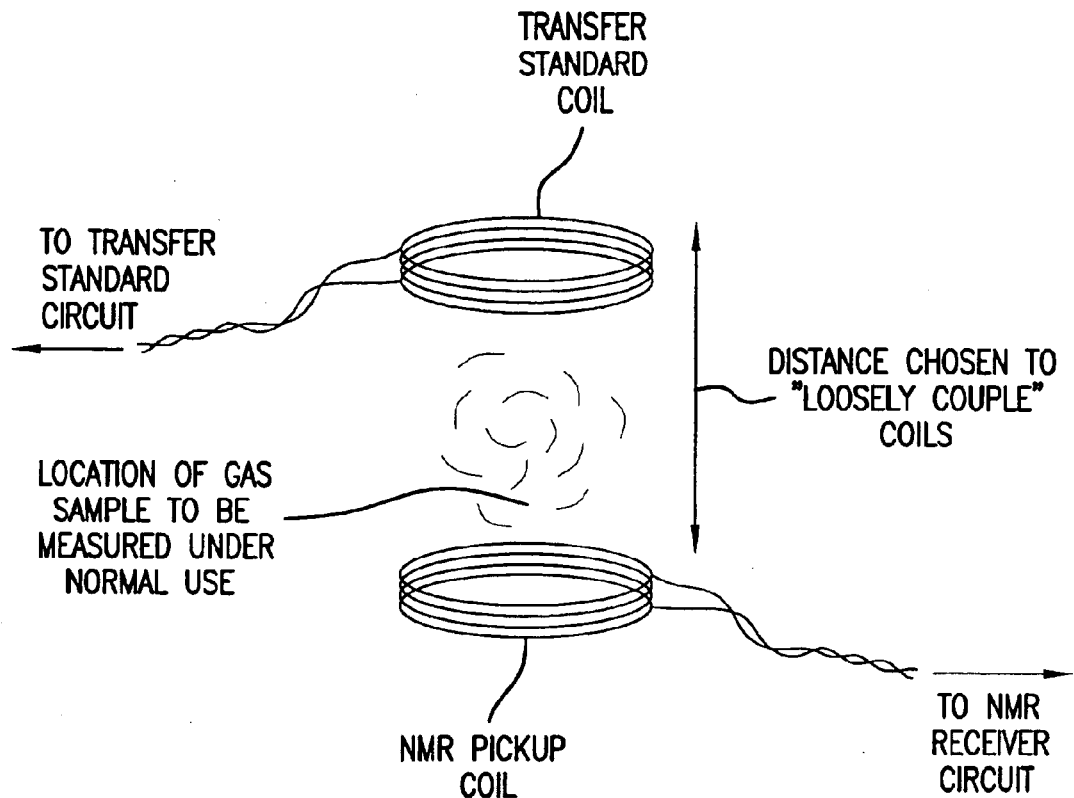
FIG. 4 depicts a transfer standard coil located axially-aligned with an NMR pickup coil.
Figure 5:
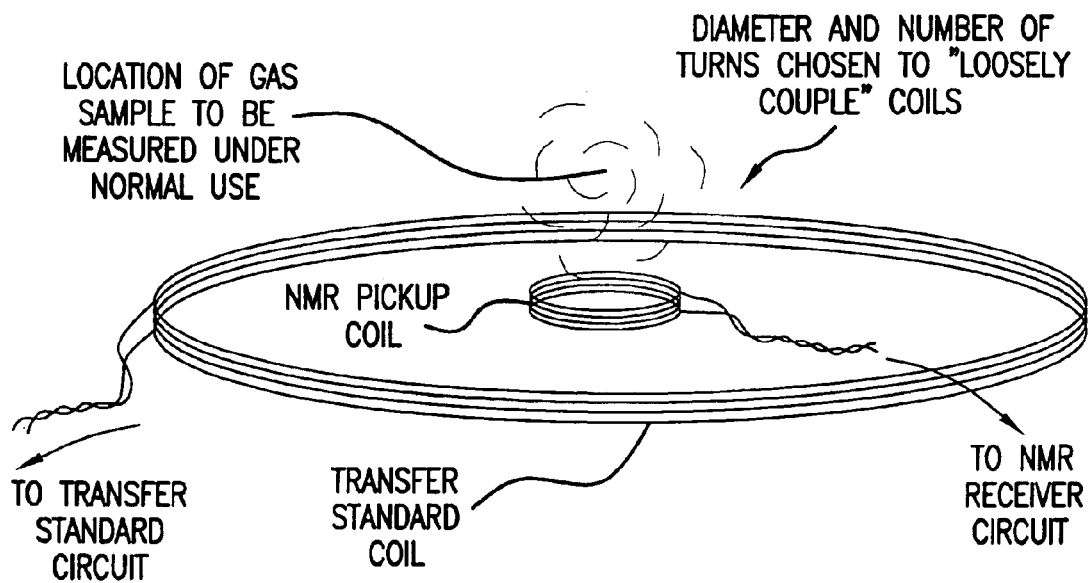
FIG. 5 depicts a transfer standard coil in coplanar alignment with an NMR pickup coil.

Transfer coil 24 of transfer standard 10 desirably includes a geometry selected such that it is "loosely" coupled to pickup coil 14 in polarization measurement station 12. Here "loosely" coupled is taken to mean that the resonant frequency and quality factor (Q) of the NMR pickup circuit to which pickup coil 14 is connected are changed negligibly by the addition of transfer standard 10. FIGS. 4 and 5 illustrate 2 possibilities for this geometry. FIG. 4 depicts a transfer standard coil which is coaxial with the NMR pickup coil while FIG. 5 depicts a transfer standard coil which is coplanar with the NMR pickup coil. As the pickup coil 14 is embedded within the planar substrate 16 of measurement station 12, the transfer coil 24 will likely always be positioned in spaced overlying registry with pickup coil 14 rather than in pure coplanar alignment. The present invention thus employs the terms 'coxial' and 'coplanar' to distinguish among differently-shaped and positioned coils resting on substrate 16. Generally, the term 'coplanar' denotes when the radius of transfer coil 14 is more than about eight times the vertical height of transfer coil 14 above substrate 16. Conversely, the term 'coaxial' generally denotes when the radius of transfer coil 14 is less than about eight times the vertical displacement of coil 14 above substrate 16.

Figure 6:
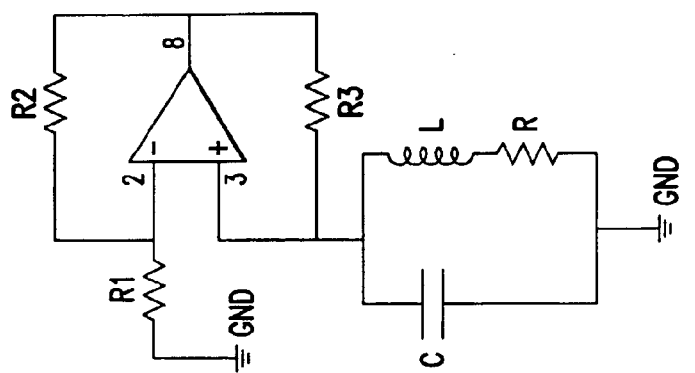
FIG. 6 depicts an LC Wien-bridge oscillator circuit.

Transfer coil 24 is incorporated into the Wien-bridge oscillator circuit 30 of FIG. 6, where the frequency selection is accomplished by means of the parallel LC tank circuit 32 (where L is transfer standard coil 24 itself). LC tank circuit 32 is desirably incorporated into container 22 so as to provide a single unit to for easier handling. Alternatively, as is described and shown hereinbelow, coil 24 and circuit 30 may be provided in separate housings and electrically connected together.

Oscillator circuit 30 makes use of negative feedback provided by the R1R2 network and positive feedback provided by the tank circuit combined with R3.

$$\left(\frac{R1+R2}{R1}\right)\left(\frac{Z}{Z+R3}\right) \geq 1.$$

The condition for stable oscillation is that the positive feedback be greater than or equal to the negative feedback. In terms of the individual components, this condition can be written as $$\left(\frac{Z}{Z+R3}\right)\left(\frac{R1+R2}{R1}\right) \geq 1,$$

where Z is the impedance of LC tank circuit 32, or:

$$Z = \frac{j\omega L + R}{1 - \omega^2 LC + j\omega RC}.$$

At the resonant frequency of tank circuit 32, Z is maximal, purely resistive, and equal to L/RC.

Figure 7:
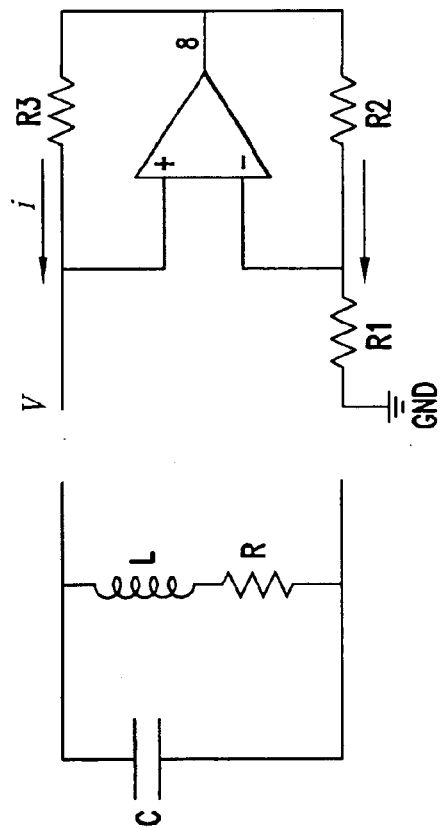
FIG. 7 depicts the LC Wien-bridge oscillator circuit of FIG. 6 redrawn as a parallel LRC circuit.

The simplest way to understand this oscillation condition is to redraw circuit 30 as a parallel LRC tank 36 in parallel with an equivalent resistance provided by an OPamp network 38, as shown in FIG. 7. Solving for the equivalent resistance of the OPamp network on the right hand side of FIG. 7, in terms of the OPamp open loop gain, $\beta$:

$$V_{OUT} = \beta(V_+ - V_-) = \beta(V - i'R_1) = \beta\left(V - \frac{V_{OUT}R1}{R1+R2}\right).$$

Now substitute for $V_{OUT}$ using $$i = \frac{V_{OUT} - V}{R3},$$

yielding:

$$R_{eq} = -V/i = -R3\frac{R1+R2+\beta R1}{-R1-R2+\beta R2} \approx -\frac{R1R3}{R2}.$$

whereby the equivalent resistance is negative, i.e., if a voltage is applied to the circuit, a current flows backward. Now, the condition for oscillation is that the energy supplied by the negative resistance each cycle must be greater than or equal to the energy dissipated in the tank circuit. The energy dissipated in the tank is given by $$\Delta U = \frac{2\pi U}{Q} = \frac{\pi C V_{max}^2}{Q},$$

while the energy supplied by the negative resistance is equal to $$\Delta U' = -\int_0^T \frac{V_{max}^2}{R_{eq}}\sin^2\omega t\,dt = -\frac{\pi V_{max}^2}{\omega R_{eq}}.$$

The oscillation condition is then $\Delta U \geq \Delta U'$, or $$-R_{eq} \leq \frac{Q}{\omega C},$$

or, substituting our previous result for $R_{eq}$ and $Z=L/RC$ on resonance, $$\frac{R1R3}{R2} \leq Z,$$

This condition is most easily satisfied at the resonant frequency of tank cicuit 36, and so it is there that the Wienbridge will oscillate.

In practice, the components of the transfer standard circuit are chosen such that oscillation condition is approached without actually being met. The circuit then behaves like a parallel LRC circuit with very high equivalent quality factor, $Q_{eq}$ ($Q_{eq}$ is selected, for 24 kHz operation, to be approximately 1500). This is useful as a transfer standard because a sample of polarized gas behaves very much like a high-Q LRC circuit loosely coupled to the NMR pickup coil used to detect the polarization.

Transfer standard coil 24 itself should be chosen such that the polarimetry circuit's operation is not affected by the presence of the transfer standard (e.g. resonant frequency and Q changed by less than 1%). In terms of the mutual inductance M of the two coils and the indutance $L_{nmr}$ of the NMR coil, it is desired that $M \ll L_{nmr}$. There are two practical ways to accomplish this: 1) provide a transfer standard coil 24 which is coaxial with the NMR pickup coil 14 and separated by a distance large compared to the coil radii, and 2) provide a transfer standard coil 24 which is coplanar with and much larger than the NMR pickup coil 14.

When providing transfer standard coil 24 coaxial with NMR pickup coil 14, the mutual inductance of two N-turn coaxial loops is given by $$M \approx \frac{\mu_0 \pi}{2d^3}(N_{nmr}a_{nmr}^2)(N_{ts}a_{ts}^2).$$

Where $N_{nmr}$ is the number of turns in the NMR pickup coil, $N_{ts}$ is the number of turns in the transfer standard coil, $a_{nmr}$ is the diameter of the nmr pickup coil, $a_{ts}$ is the diameter of the transfer standard coil, and d is the distance between the loops. Also, d is much larger than the radius a of either loop. The solution of the mutual inductance of two identical coaxial loops is given in Jackson, J. D., *Classical Electrodynamics*. 2 ed. 1975, New York: John Wiley & Sons, pg. 848, problem 6.7, which is hereby incorporated by reference herein. The disadvantage of such geometry is that the coupling between the two coils is a very sensitive function of the separation distance ($M \propto d^{-3}$). The advantage of such geometry is that the coupling can be easily adjusted by varying this distance.

When providing transfer standard coil 24 coplanar with NMR pickup coil 14, the mutual inductance of the two loops is given by $$M \approx \frac{\mu_0 \pi}{2a_{ts}} N_{nmr} N_{ts} a_{nmr}^2.$$

The significant advantage of this geometry is that the apparent polarization of transfer standard 10 is relatively insensitive to the placement of transfer standard coil 24. Moreover, calculations show that the apparent polarization of an 8" transfer standard coil should drop by approximately 1% for a ⅛" lateral displacement (from concentric) and approximately 1% for a ¾" vertical displacement (from coplanar). Such low variance is a significant finding as transfer standard 10, being typically positioned on top of plate 16, will not be precisely coplanar with pickup coil 14 but will have a small vertical displacement.

During the transmitted pulse, transfer standard coil 24 "rings up". Voltage is added to the coil at a rate $$\frac{dV_{ts}}{dt} = -M\frac{d^2 I_p}{dt^2} = -M\frac{d^2}{dt^2}\left(\frac{V_p\cos\omega t}{j\omega L_{nmr}}\right) = \frac{M\omega}{L_{nmr}}V_p,$$

where $I_p$ is the current in the nmr coil and $V_p \cos \omega t$ is the pulse voltage applied to the nmr coil. Here one can drop the phase information and the $\cos \omega t$, and just recall that every differentiation gives another factor of $\omega$. As voltage decays in the coil at the rate $V_{ts}/T_2^*$, the ring up is then described by $$\frac{dV_{ts}}{dt} = \frac{M\omega}{L_{nmr}}V_p - \frac{1}{T_2^*}V_{ts},$$

where $T_2^*$ denotes the relaxation time of the coil oscillations (analogous to the transverse relaxation time of a polarized sample).

The solution to this differential equation is $$V(t) = \frac{M\omega V_p T_2^*}{L_{nmr}}(1 - e^{-t/T_2^*}).$$

By operating with $T_2^*$>>pulse duration, the ring up will be approximately linear:

$$V_{ts}(t) = \frac{M\omega V_p t}{L_{nmr}}.$$

The current flowing in transfer standard coil 24 will then be $$I_{ts} = \frac{V_{ts}}{\omega L_{ts}} = \frac{M V_p t}{L_{nmr} L_{ts}}.$$

The voltage induced back at the NMR coil will then be $$V_{nmr} = -M\frac{dI_{ts}}{dt} = \frac{M^2 V_p \omega t}{L_{nmr} L_{ts}}.$$

And so the apparent polarization of the transfer standard is proportional to $M^2/L_{ts}$. This leads to a different result for each of the two geometries. (For clarity, the resistance of the two coils has been ignored. The full result should read $$V_{nmr} = \frac{M^2 V_p \omega t}{L_{nmr} L_{ts}\sqrt{1 + \frac{1}{Q_{nmr}^2}}\sqrt{1 + \frac{1}{Q_{ts}^2}}}.)$$

For the coaxial geometry, $M \propto N_{ts} a_{ts}^2/d^3$, while $L \propto N_{ts}^2 a_{ts}$. The apparent polarization of the coaxial transfer standard is therefore independent of number of turns and is an incredibly sensitive function of distance ($\propto a_{ts}^3/d^6$). This distance dependence is convenient for adjusting the apparent polarization level, but constitutes difficulty for actual transfer standard use.

Figure 8:
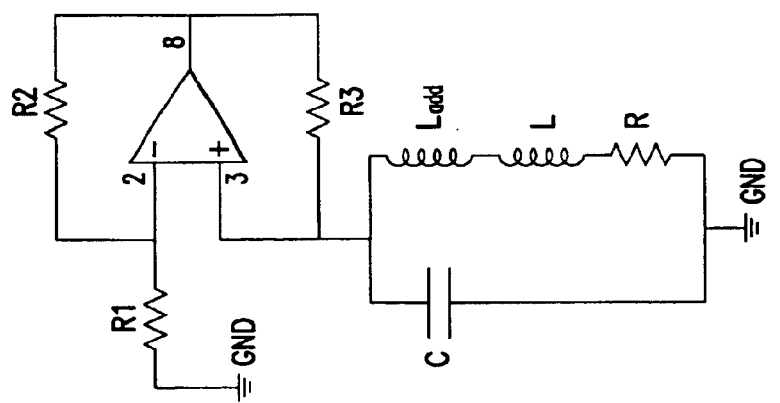
FIG. 8 depicts a tank circuit for coplanar alignment with a pickup coil having a discrete inductor in series with the transfer standard coil.

For the concentric coplanar geometry, $M \propto N_{ts}/a_{ts}$, while $L \propto N_{ts}^2 a_{ts}$. Now the apparent polarization is independent of everything except radius ($\propto 1/a_{ts}^3$). As adjusting the radius is an extremely inconvenient method of adjusting "polarization", it is useful to insert a discrete inductor in series with the transfer standard coil as shown in FIG. 8. This inductor, $L_{add}$, reduces the apparent polarization:

$$\text{apparent polarization} \propto \frac{M^2}{L_{ts}} \to \frac{M^2}{L_{ts} + L_{add}} = \frac{M^2/L_{ts}}{1 + L_{add}/L_{ts}}.$$

The "$T_2^*$" of transfer standard coil 24 is given by $$T_2^* = \frac{2\pi U}{\pi f \Delta U} = \frac{2C}{1/Z_{LRC} - 1/R_{eq}} = \frac{2C}{RC/L - R2/R1R3}.$$

Note that this just looks like an RC time constant, with R given by the parallel combination of the tank impedance on resonance and the negative equivalent resistance of the active part of the circuit. The "$T_2^*$" of transfer standard coil 24 may then be written $$T_2^* = \frac{2Q/\omega}{1 - \frac{R2}{R1R3}\frac{L}{RC}} = \frac{2Q/\omega}{1 - \chi_P},$$

where $Q = \omega L/R$ and $$\chi_P \equiv \frac{R2}{R1R3}\frac{L}{RC}.$$

It will become important that the transfer standard's response be as stable as possible. For the parallel tank circuit, the apparent polarization is a relatively insensitive function of only inductances, and so will not drift significantly with environmental factors such as temperature. $T_2^*$ is, however, a sensitive function of all elements of the circuit. It is instructive to write $$\frac{dT_2^*}{T_2^*} = \frac{d\chi}{(1-\chi)} = \frac{\omega T_2^*}{2Q}d\chi = \frac{Q_{total}}{Q}d\chi,$$

where $Q_{total} = \pi f T_2^*$ denotes the apparent $T_2^*$ of the entire circuit (e.g., $Q_{total}$=1500 for a 20 ms $T_2^*$ at 24 kHz). It is clear from this expression that though a transfer standard circuit may be constructed using a poor (i.e. low Q) tank by using a smaller negative resistance to make up the losses, it is preferable to use the best tank possible.

EXAMPLE 1

A bag of $^3$He in the fairly homogeneous holding field of the polarimetry station looks to the polarimetry circuit similar to be a loosely coupled coil with large but finite Q.

In order to demonstrate proof of concept, one prototype circuit was built using the coaxial coil geometry. The components for the transfer standard have therefore been selected as shown in Table 1 so as to approach, but to not actually meet, the oscillation condition. Note that the value of R in Table 1 is approximate; a standard tuning box and coil were used for the LRC tank circuit, so the value of R listed below represents the resistance of the coil plus the added resistor in the tuning box. A 350 turn NMR surface coil and 22 nF capacitor were used as the transfer standard LC tank, and vertically displaced 1¾" above the pickup coil. The Q and the resonant frequency of the polarimetry circuit were not changed by the addition of the transfer standard to within the normally displayed resolution (<1% on Q, <50 Hz on f0).

TABLE 1

| Circuit values for prototype Coaxial transfer standard. | |
|---|---|
| R1 | 82k |
| R2 | 20k 10-turn pot. |
| R3 | 1k |
| L | 2.13 mH |
| R | 10 Ω |
| C | 22 nF |

Figure 9:
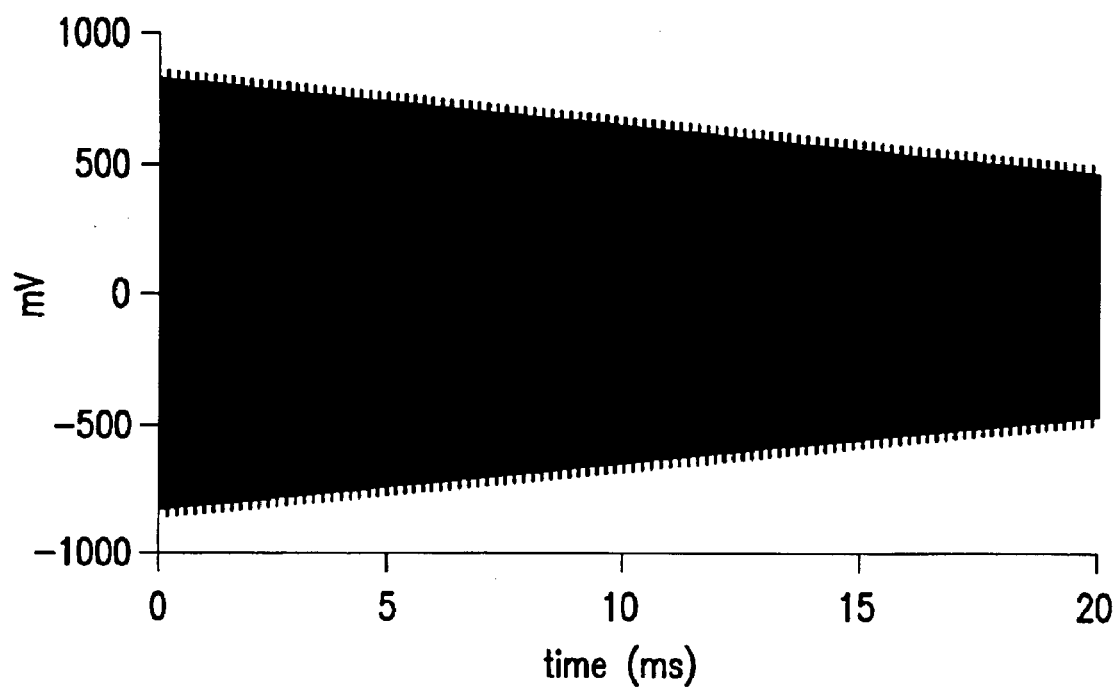
FIG. 9 depicts an example of a free induction decay (FID) of a sample of 17.2% polarized 3He.
Figure 10:
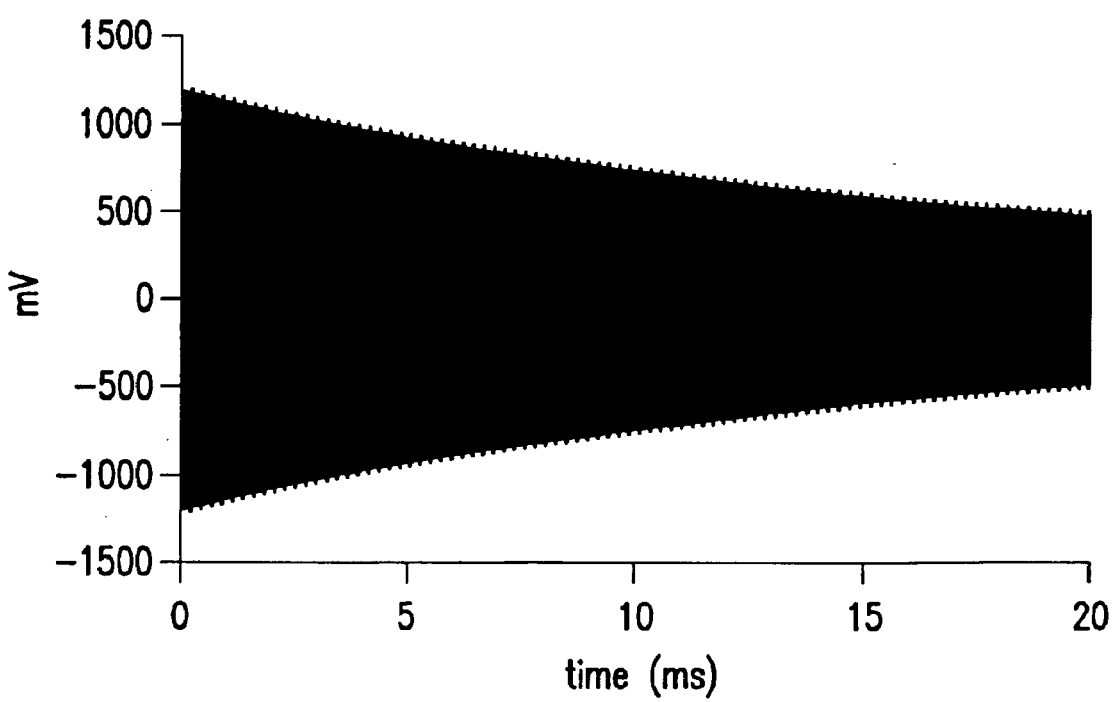
FIG. 10 depicts the response signal from a transfer standard device exhibiting 23.8% apparent polarization

FIG. 9 shows the signal obtained on a polarization measurement device using the prototype transfer standard (also shown is an FID from actual $^3$He for comparison, though this FID was acquired on a different device of the same design). The transfer standard signal was measured as a function of both pulse duration and voltage. The results of these measurements are displayed in FIG. 10.

The nonzero y-intercept in signal vs. pulse duration is entirely due to the pulse ringdown (no Q-switch was employed). The behavior of signal vs. pulse voltage at low voltage is due to the diode gate in the polarimetry transmit circuit; its effect may be approximated by subtracting a voltage equal to two diode drops from the pulse voltage applied. The remaining nonzero y-intercept is again due to pulse ringdown.

EXAMPLE 2

Figure 11:
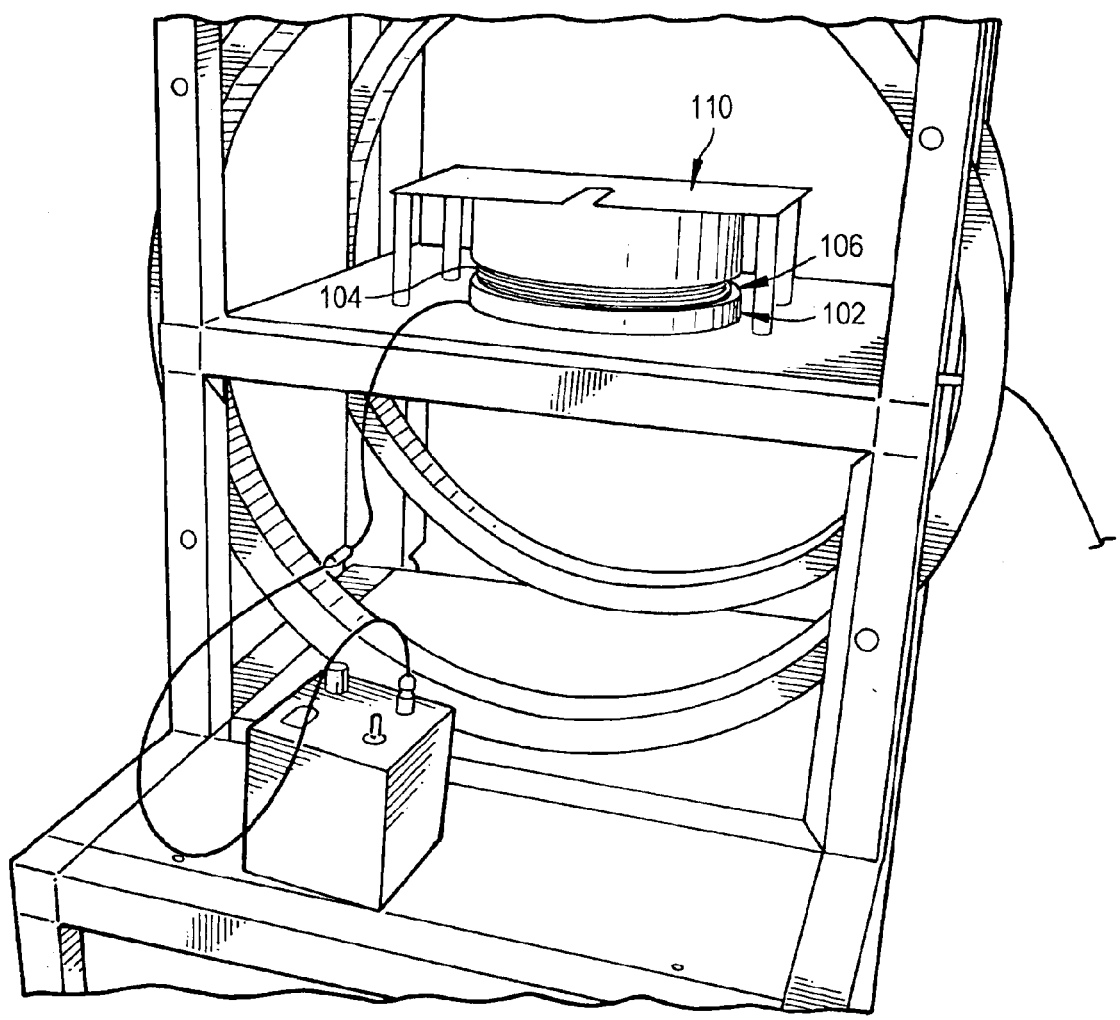
FIG. 11 depicts a concentric coplanar transfer standard demonstration device.

With reference to FIG. 11, a concentric coplanar transfer standard 110 was constructed using an 8" diameter ½" thick PVC pipe as a coil form 102. 100 turns of wire 104 were wound in a channel 106 machined on form 102. The coil was tuned to roughly match the polarimetry circuit and the effect of the transfer standard on the polarimetry circuit's parameters (by looking for a change in the "coil test" response) was determined. This procedure was repeated, removing a few turns at a time, until no change in the response was visible. It was determined that only 5 turns were required for the transfer standard.

The Wien oscillator circuit was then constructed around the 5-turn coil and the apparent polarization was measured. It was decided to cut the apparent polarization by a factor of approximately 15 by adding an additional 220 $\mu$H inductor (Coilcraft #90-41) in series with the transfer standard coil, as described above (note that this inductor has a large DC resistance, ~10$\Omega$, and a correspondingly low Q).

TABLE 2

Circuit values for 1$^{st}$ coplanar transfer standard.

| | |
|---|---|
| R1 | 5.6k |
| R2 | 20k 10-turn pot. |
| R3 | 475 |
| L | 15 $\mu$H + 220 $\mu$H |
| R | ~10 $\Omega$ |
| C | 150 nF + 47 nF |

The circuit oscillated with R2=12.5 k, suggesting that the AC resistance R of the inductor was closer to $$R \approx \frac{LR2}{R1R3C} \approx 6\Omega.$$

Figure 12:
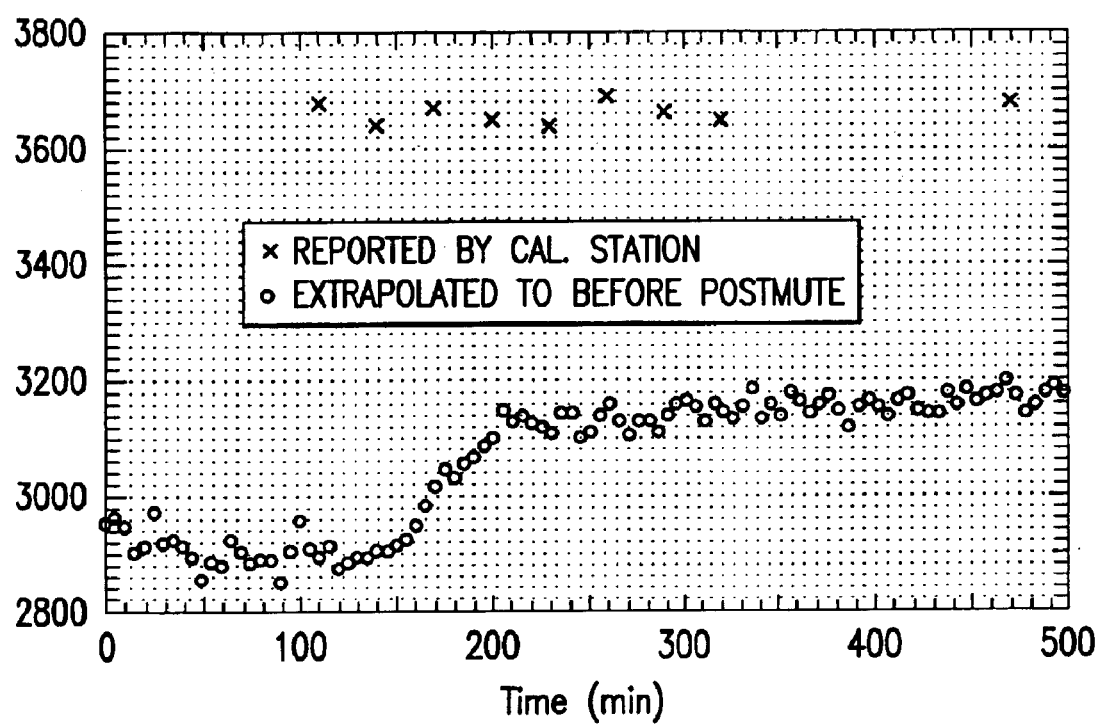
FIG. 12 shows the peak-to-peak values of the FIDs as reported by the calibration station (open circles) as well as selected peak-to-peak values obtained by extrapolating the exponential FID envelope function back to before the 3 ms postmute time.

This circuit was tested for stability by placing it on a measurement station. The apparent polarization was measured every 5 minutes for approximately 8 hours. FIG. 12 shows the peak-to-peak values of the FIDs as reported by the calibration station (open circles) as well as selected peak-to-peak values obtained by extrapolating the exponential FID envelope function back to before the 3 ms postmute time. The data shows that though the apparent polarization was constant to approximately 1%, the $T_2^*$ varied greatly, increasing rapidly from 10.5 ms at 6 PM to 16.5 ms at 10 PM. Owing to the relatively poor Q of the tank (Q~6), this increase could be caused by only a ~0.3% change in $\chi$.

The $L_{add}$ inductor in the circuit was then replaced with a power filter choke (Coilcraft PCH-45-224). The circuit then oscillated at R2=1.2 k, suggesting R=0.92 (we replaced the 5-turn coil with a short and then R=0.84). This gives Q=30. A longer stability test was performed using the reference calibration station, recording a FID every 15 minutes for 72 hours. Again, though $T_2^*$ drifted between 27 and 58 ms, the apparent polarization (FID extrapolated back to before postmute time) varied by approximately 2%.

Figure 13:
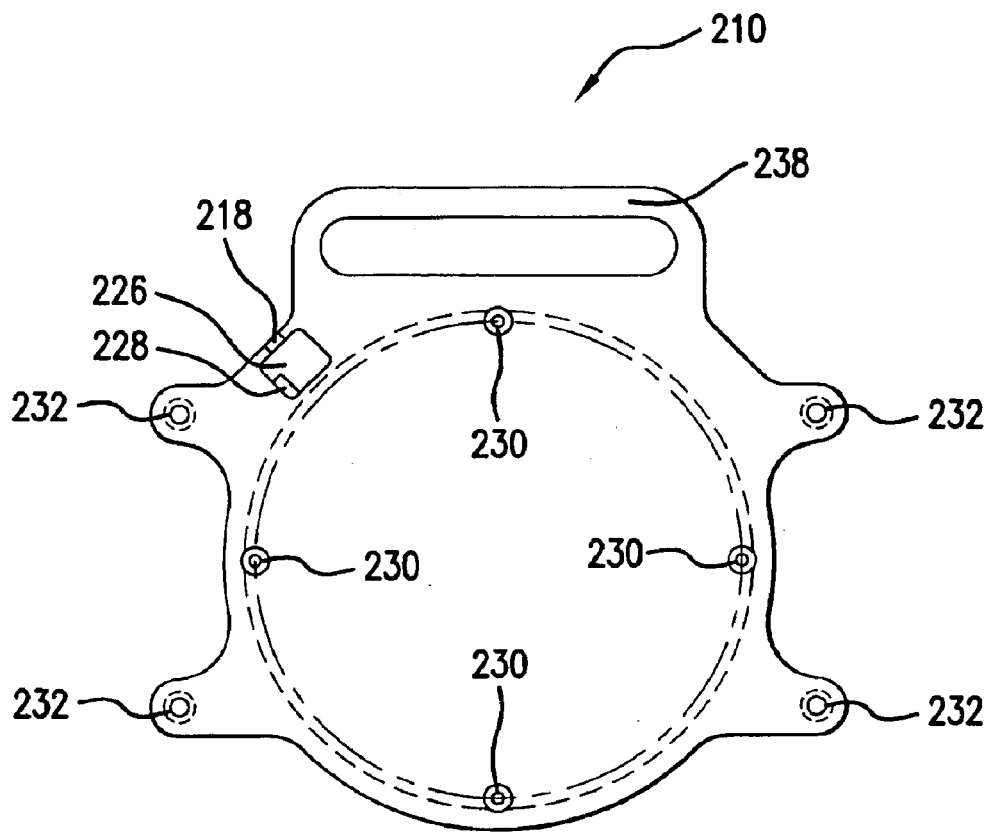
FIGS. 13 and 14 depict an alternate embodiment of a transfer standard of the present invention.
Figure 14:
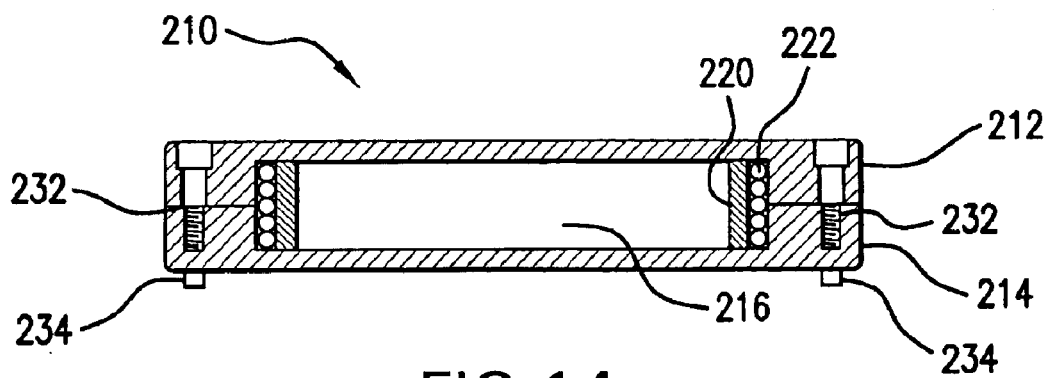

FIGS. 13 and 14 depict an alternate transfer standard 210 of the present invention. Transfer standard 210 includes mating housing components 212 and 214 which define therebetween a coil cavity 216 and a circuit compartment 218 (shown by phantom lines in FIG. 13). Coil cavity 216 receives a coil form 220 about which a transfer standard coil 222 having a 5-turn loop 224 and a connected active circuit 226 powered by a battery 228. Housing components 212 and 214 are desirably formed from a non-ferrous material, such as a suitable plastic. A number of screws 230 hold coil form 220 in place with respect to housing components 212 and 214 while screws 232 hold components 212 and 214 together. Other fastening devices as well as adhesives are contemplated for performing the function of screws 230 and 232. Tranfer standard 210 further includes cylindrical pins 234 depending from second housing component 214. Pins 234 are spaced to matingly engage tap apertures 236 defined by the upward-facing major surface of planar substrate 216 so as to ensure the proper alignment of transfer standard 210 with respect to the NMR coil 14 of calibration station 10. Proper alignment of transfer standard 210 and NMR coil 14 will minimize errors in measuring the apparent polarization of transfer standard 210.

While the particular embodiment of the present invention has been shown and described, it will be obvious to those skilled in the art that changes and modifications may be made without departing from the teachings of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A device for simulating a sample of gas having a specific level of polarization when measured by an instrument including an NMR pickup coil, said device comprising:

an active circuit coupled to the NMR pickup coil, wherein said active circuit responds as a hyperpolarized gas having the specific level of polarization when measured by the NMR pickup coil.

2. The device of claim 1, wherein said active circuit is loosely coupled to the NMR pickup coil.

3. The device of claim 2, wherein said active circuit includes a transfer standard coil.

4. The device of claim 3, wherein said active circuit includes a power supply.

5. The device of claim 4, wherein said power supply is provided by batteries coupled to the active circuit.

6. The device of claim 5, wherein said active circuit further comprises a high-Q oscillator circuit.

7. The device of claim 6, wherein said oscillator circuit is an LRC circuit.

8. The device of claim 7, wherein said oscillator circuit is a Wien-bridge circuit.

9. The device of claim 8, wherein said active circuit has a Q level of approximately 1500 at 24 kHz.

10. The device of claim 1, wherein said active circuit includes an LRC tank circuit comprising a transfer coil connected to a tuning box.

11. A method for testing the calibration of an instrument for measuring the polarization of a sample, wherein the instrument includes an NMR pickup coil connected to NMR pickup circuitry, said method comprising the steps of:

placing an active circuit adjacent to the NMR pickup coil, wherein said active circuit is coupled to the NMR pickup coil and responds as a hyperpolarized gas having a specific level of polarization when measured by the NMR pickup coil.

12. The method of claim 11, further comprising the steps of:

positioning the active circuit within a calibrated polarization measurement device;

determining the apparent polarization of the active circuit; and assigning the apparent polarization as the specific level of polarization.

13. The method of claim 12, further comprising the step of:

adjusting the instrument for measuring the polarization of a sample so as to be calibrated to read the specific level of polarization of the active circuit.

14. The method of claim 11, wherein said active circuit includes a transfer standard coil loosely coupled to the NMR pickup coil and NMR pickup circuitry.

15. The method of claim 14, wherein said active circuit further comprises a high-Q oscillator circuit.

16. A method for calibrating a polarization measurement station having an NMR pickup coil connected to NMR pickup circuitry, comprising the steps of:

placing an active circuit adjacent to the NMR pickup coil, wherein said active circuit responds as a hyperpolarized gas having a specific level of polarization when measured by the NMR pickup coil; and adjusting the instrument for measuring the polarization of a sample so as to be calibrated to read the specific level of polarization of the active circuit.

17. The method of claim 16, further comprising the steps of:

positioning an active circuit within a calibrated polarization measurement device;

determining the apparent polarization of the active circuit; and assigning the apparent polarization as the specific level of polarization.

* * * * *